(12) United States Patent
Chalamala et al.

(10) Patent No.: US 7,884,650 B2
(45) Date of Patent: Feb. 8, 2011

(54) ANALOG COMPARATOR COMPRISING A DIGITAL OFFSET COMPENSATION

(75) Inventors: Sreenivasa Chalamala, Dresden (DE); Matthias Baer, Hohenstein-Ernstthal (DE)

(73) Assignee: Advanced Micro Devices, Inc., Austin, TX (US)

( * ) Notice: Subject to any disclaimer, the term of this patent is extended or adjusted under 35 U.S.C. 154(b) by 110 days.

(21) Appl. No.: 12/270,983

(22) Filed: Nov. 14, 2008

(65) Prior Publication Data
US 2009/0243663 A1    Oct. 1, 2009

(30) Foreign Application Priority Data
Mar. 31, 2008    (DE) .................. 10 2008 016 428

(51) Int. Cl.
*H03K 5/22* (2006.01)
(52) U.S. Cl. .............................. 327/65; 327/63; 327/70
(58) Field of Classification Search .................. 327/63, 327/65, 70
See application file for complete search history.

(56) References Cited

U.S. PATENT DOCUMENTS

| | | | |
|---|---|---|---|
| 4,987,327 A | 1/1991 | Fernandez et al. | 307/491 |
| 5,812,005 A | 9/1998 | Ezell et al. | 327/307 |
| 6,072,349 A | 6/2000 | Pippin et al. | 327/307 |
| 6,433,712 B1 * | 8/2002 | Ohnhaeuser et al. | 341/118 |
| 7,285,988 B2 | 10/2007 | Higuchi et al. | 327/66 |
| 7,541,857 B1 * | 6/2009 | Wong et al. | 327/317 |
| 2003/0214351 A1 | 11/2003 | Nandy et al. | 330/9 |
| 2005/0030081 A1 | 2/2005 | Kishii | 327/307 |
| 2007/0090873 A1 | 4/2007 | Higuchi | 330/9 |

FOREIGN PATENT DOCUMENTS

EP    0 924 854 B1    12/2001

OTHER PUBLICATIONS

Translation of Official Communication from German Patent Office for German Patent Application No. 10 2008 016 428.3-56 dated Nov. 3, 2008.

* cited by examiner

*Primary Examiner*—Lincoln Donovan
*Assistant Examiner*—John W Poos
(74) *Attorney, Agent, or Firm*—Williams, Morgan & Amerson, P.C.

(57) ABSTRACT

A digital compensation of an input stage of a comparator may be achieved by providing switched load elements, which may be appropriately connected to the differential input pair of the comparator in order to match transistor characteristics of the input pair and also match the load value of the input stage. Thus, enhanced offset behavior may be accomplished without providing an external signal and/or without requiring complex reference voltages/currents.

23 Claims, 5 Drawing Sheets

ANALOG COMPARATOR COMPRISING A DIGITAL OFFSET COMPENSATION

BACKGROUND

1. Field of the Disclosure

The present disclosure generally relates to electronic circuits having an analog comparator and also relates to integrated circuit devices and designs including an analog comparator circuit.

2. Description of the Related Art

In electronic designs and circuits, the amplitude of a signal level frequently has to be determined with a specified degree of accuracy. For this purpose, a plurality of techniques have been developed, wherein many of these techniques include the comparison of a first signal level with a second signal level in order to decide whether the first signal level is higher or lower compared to the second signal level. Thus, a respective electronic circuit may provide a digital response to the question of which of two signals has a higher signal level. Corresponding electronic circuits may typically be referred to as a comparator or as an analog comparator, when at least one of the two signal levels may vary continuously. For instance, such comparator circuits may be significantly used in situations in which a signal is to be compared with a reference signal, which may represent a substantially constant reference or a varying reference, so as to indicate by a digital response when the signal crosses the threshold defined by the reference signal. A comparator circuit typically comprises an appropriately designed input stage, including a pair of input transistors, which may receive the respective input signals. Furthermore, a resistive load may be connected to each of the input transistors to obtain a differential voltage, depending on the difference of input signals. The differential voltage may be supplied to an output stage, which is typically designed to provide two predefined output signal levels depending on the voltage across the differential input stage. Consequently, for sophisticated applications, the characteristics of the circuit elements, in particular of the input transistors and the respective resistive loads, may have to be matched to each other to obtain a change of the output signal at a desired minimum value of the difference of the two input signals. Moreover, the response of the comparator circuit to input signal should typically be as stable as possible for varying operational conditions, such as different temperatures, varying supply voltages, aging of the circuit components, and any other environmental influences, such as humidity, pressure and the like. Consequently, complex compensation techniques have been proposed, which in turn may itself require sophisticated and complex analog circuitry, which may contribute to overall design complexity and production costs.

With reference to FIGS. 1a-1b, a typical conventional comparator circuit will now be described so as to more clearly discuss any problems caused by an inefficient offset compensation.

FIG. 1a schematically illustrates a circuit diagram of a comparator circuit 100 according to a conventional basic circuit configuration. As illustrated, the comparator circuit 100 comprises an input stage 110 for receiving a first input signal V− and a second input signal V+. The signal V− may be received by a first input transistor 111A, while the second input signal V+ may be received by a second input transistor 111B. In the example shown in FIG. 1a, the first and second input transistors 111A, 111B may be represented by a P-channel transistor or by a PNP transistor, if a bipolar transistor configuration is considered. It should be appreciated that transistors of a different conductivity type may be used, if desired. Furthermore, the input stage 110 comprises a first resistive load 112A connected in series to the first transistor input 111A and also comprises a second resistive load 112B connected in series to the second transistor input 111B. Additionally, the input stage 110 may comprise a constant current source 113 connected to both branches comprised of the first input transistor 111A and the first resistive load 112A and the second input transistor 111B and the second resistive load 112B, respectively. Moreover, the voltage across one of the resistive loads 112A, 112B may be used as an intermediate output signal 114 that is supplied to an output stage 120. In the example shown, the intermediate output signal 114 of the input stage 110 may be obtained across the resistive load 112B. Furthermore, the output stage 120 is typically appropriately configured so as to settle in one of two output voltage levels, for instance near the positive supply voltage or the negative supply voltage, depending on the intermediate signal 114. For convenience, the output stage 120 is illustrated as an inverting amplifier with a very high gain so as to saturate at one of the voltage levels, depending on the intermediate signal 114, thereby providing the digital response to the input signals V− and V+. In this case, the second input transistor 111B may be referred to as a non-inverting input transistor, while the first input transistor 111A may be referred to as an inverted input, since a higher signal level at the input transistor 111A may result in a swing of the output 121 to the negative level.

During operation of the comparator circuit 100, the constant current source 113 supplies a constant current to the node 113A, which may result in a current flow through the transistors 111A and the load 112A on the one hand and through the transistor 111B and the load 112B on the other hand. Consequently, if the respective components 111A, 111B, 112A, 112B and 113 are provided as substantially ideal components, a small difference, indicated as $\Delta V$ may result in a corresponding variation of the output voltage 114, since, in this case, the conductivity of one branch may be reduced or increased, thereby creating respective different currents in both branches, since the current supplied to the node 113A is maintained constant. As a consequence, the intermediate output voltage 114 may vary in accordance with the difference of the supplied input voltage so that the output stage 120 may go into positive saturation or negative saturation, depending on the sign of the difference of the input voltages V−, V+.

FIG. 1b schematically illustrates the diagram in which the output voltage 121 of the output stage 120 is qualitatively plotted against the difference of the input voltages V+, V−. It may be assumed that the difference $\Delta V$ may vary between −500 millivolts and +500 millivolts, while the output stage 120 may saturate at +3 volts and −3 volts. It should be appreciated, however, that any other voltage ranges for the input voltage and the output voltage may be selected, depending on the device requirements, wherein typically at least the output voltage range may be substantially determined by the supply voltage of the comparator 100. As illustrated for a negative value of the difference $\Delta V$, i.e., where V− is greater than V+, the output voltage 121 may be approximately −3 volts. When reducing the absolute amount of V− or by increasing the amount of V+, the difference $\Delta V$ may be less negative and may finally result in a change of polarity of the output voltage 121, while, in the example shown, the difference $\Delta V$ may still be negative. The value of the threshold level T, at which the output voltage 121 changes, may depend on the overall configuration of the comparator 100 and in particular may depend on the characteristics of the input stage 110. Thus, depending on non-uniformities, which may be caused during the fabrication of the device 100 or which may be caused by varying conditions during the operation, such as a change in temperature and the like, the value of T may also vary, thereby resulting in a non-stable response of the comparator circuit 100 with respect to the input voltage difference ΔV. The amount of change in T from its ideal value is called offset voltage. Consequently, for obtaining a substantially stable response of the comparator 100, compensation techniques are frequently used to reduce the offset voltage of the input stage 110 to achieve the ideal value of the threshold T, wherein the corresponding compensation techniques require more or less effort, depending on the degree of uniformity or stability desired. In other cases, the circuitry of the input stage 110 itself may be configured such that an increased level of stability may be accomplished, which may typically require significant effort in terms of additional analog circuit components and/or process techniques and calibration procedures.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the present disclosure relates to electronic circuits and respective devices and methods for efficiently adjusting the operational behavior of a comparator circuit on the basis of a digital offset compensation technique. The methods and devices disclosed herein reduce circuit complexity and thus production costs, while also enhancing techniques for adjusting the response of the comparator with respect to manufacturing-induced non-uniformity and/or varying operating conditions and the like. To this end, the resistive load of one or both of the input transistors may be adapted during a specific calibration mode, while simultaneously monitoring the output signal to identify an appropriate resistive load state of the input stage, thereby obtaining a high degree of accuracy in matching the components of the differential input stage. The adaptation of the load state of the input stage may be accomplished on the basis of discrete resistive load elements, thereby providing the potential for avoiding complex analog compensation circuits while also enabling the application of an efficient calibration algorithm. In some illustrative aspects disclosed herein, the resistive load elements may be connected to one of the load elements of the input transistors such that an increasing or decreasing sequence of total load values may be obtained, while a change of polarity of the output signal may indicate an appropriate total load value to be used during a normal operational mode of the comparator circuit. The sequential generation of increasing or decreasing total load values for one of the input transistors may, in some illustrative aspects disclosed herein, be controlled on the basis of a counter, the operation of which may be disabled upon detection of a change of polarity of the output signal. Consequently, an efficient offset compensation may be achieved, wherein, in some cases, an externally supplied control signal may not be necessary, while substantially "ideal" reference voltages or reference currents may not have to be provided.

One illustrative electronic circuit disclosed herein comprises a differential input stage having a first input transistor and a second input transistor for receiving a first analog input signal and a second analog input signal, respectively, wherein the differential input stage is configured to provide an intermediate signal representing a difference of the first and second input signals. The electronic circuit further comprises an output stage coupled to the differential input stage to receive the intermediate signal, wherein the output stage is configured to provide a digital output signal on the basis of the intermediate signal. Furthermore, the electronic circuit comprises an offset compensation stage coupled to the differential input stage and the output stage, wherein the offset compensation stage is configured to receive the digital output signal and to change a load of one of the first and second input transistors in discrete steps on the basis of the digital output signal.

One illustrative integrated circuit disclosed herein comprises a substrate and a first input transistor and a second input transistor formed above the substrate. The first and second input transistors form a differential input stage for receiving a first analog input signal and a second analog input signal, respectively, wherein the differential input stage is configured to provide an intermediate signal representing a difference of the first and second input signals. The integrated circuit further comprises a plurality of output transistors formed above the substrate to form an output stage that is coupled to the differential input stage to receive the intermediate signal, wherein the output stage is configured to provide a digital output signal on the basis of the intermediate signal. The integrated circuit further comprises a plurality of control transistors formed above the substrate to form an offset compensation stage coupled to the differential input stage and the output stage. The offset compensation stage is configured to receive the digital output signal and to change a load of one of the first and second input transistors in discrete steps on the basis of the digital output signal.

One illustrative method disclosed herein relates to the compensation of an offset of a comparator. The method comprises creating a plurality of different load states of a load of at least one of a first input transistor and a second input transistor of the comparator during an offset calibration mode. The method additionally comprises monitoring an output voltage of the comparator for the plurality of different load states and selecting one of the plurality of different load states for operating the comparator in a normal operating mode.

BRIEF DESCRIPTION OF THE DRAWINGS

The disclosure may be understood by reference to the following description taken in conjunction with the accompanying drawings, in which like reference numerals identify like elements, and in which.

Figure 1A:
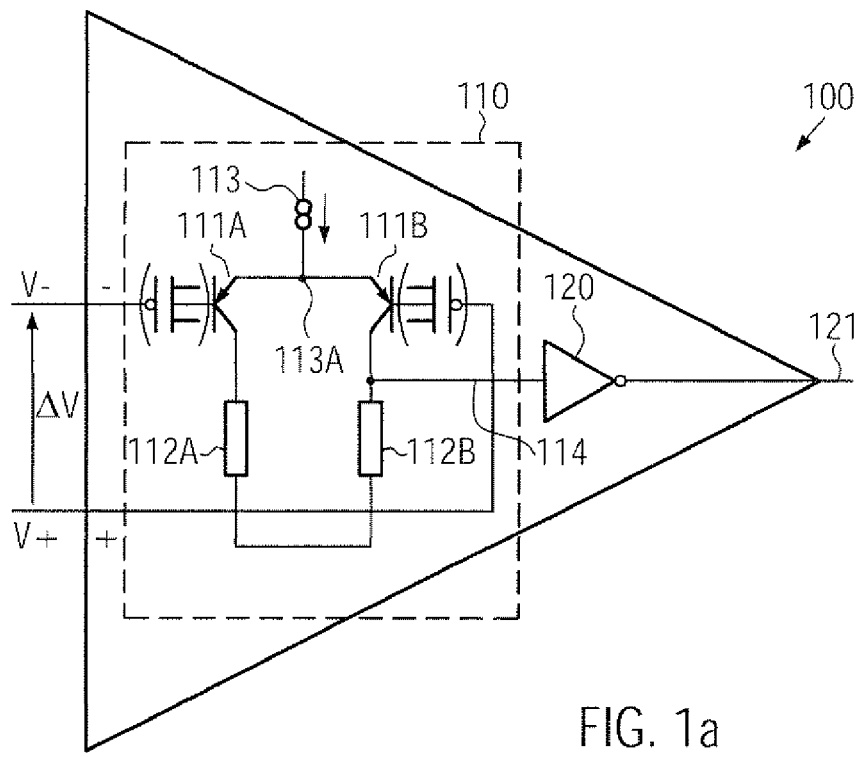
FIG. 1a schematically illustrates a schematic circuit diagram of a comparator circuit according to conventional design.
Figure 1B:
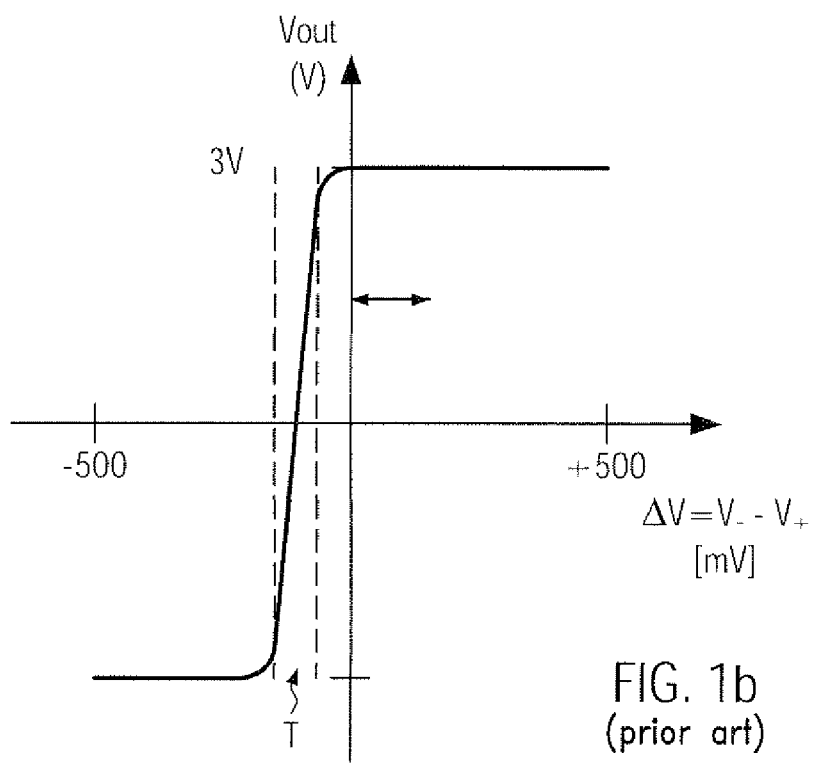
FIG. 1b schematically illustrates the response of the conventional comparator to an input voltage difference.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to electronic circuits, integrated circuits and methods for efficiently compensating for offset variations of an analog comparator circuit by appropriately adapting the resistive load of the input stage, which may be accomplished in some illustrative aspects disclosed herein by providing discrete switched load elements. Consequently, a specified calibration mode may be enabled for compensating for manufacturing-induced non-uniformities or may be enabled at any appropriate point in time, for instance, on demand by other circuit components, upon power-up, on a regular basis and the like, so that matching of the input stage of the comparator may be accomplished on the basis of the switched load elements in view of production-induced non-uniformities and/or varying conditions during the operation of the comparator circuit. Providing a plurality of additional load elements allows for an efficient compensation procedure by using digital circuit components, thereby maintaining overall circuit complexity at a low level, while, in other cases, when additional digital logic may be incorporated in the electronic circuit, at least a portion of the overall control functions may be taken over by resources of the digital logic. Thus, in some illustrative embodiments, the offset compensation mechanism may be accomplished without additional external control signals, which may be advantageous for incorporating the comparator circuit into existing circuit designs without requiring additional I/O (input/output) resources.

Figure 2A:
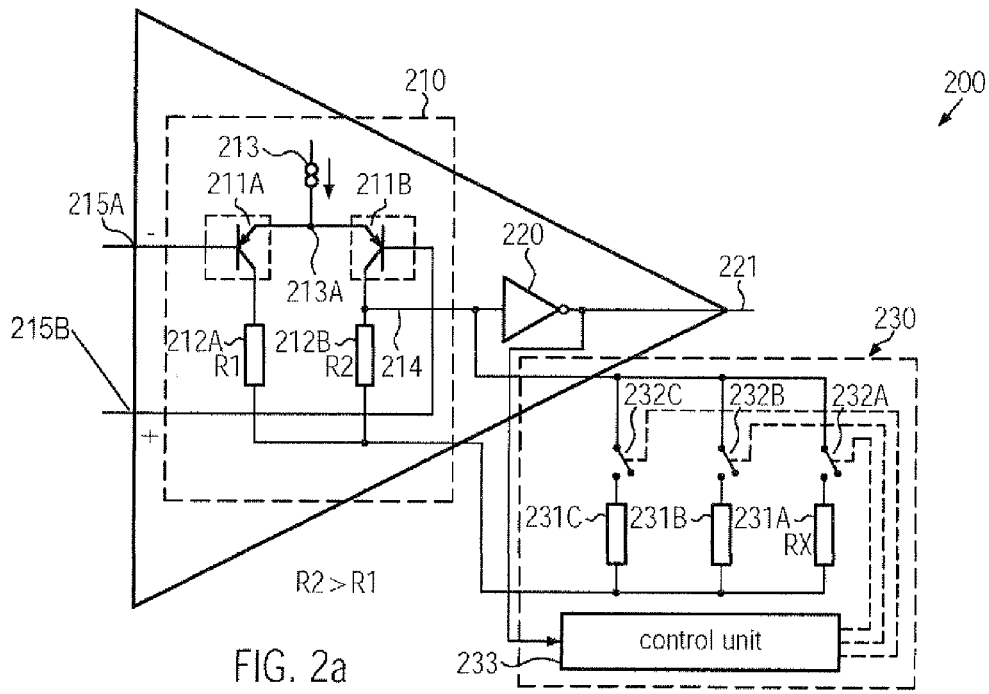
FIG. 2a schematically illustrates a comparator circuit including an offset compensation stage with a plurality of switchable load elements according to illustrative embodiments.

FIG. 2a schematically illustrates a circuit diagram of an electronic circuit 200, which may represent a comparator circuit including an efficient offset compensation mechanism. The electronic circuit 200 may comprise an input stage 210, an output stage 220 and an offset compensation stage 230. The input stage 210 may represent a differential input stage comprising a first input transistor 211A, which may represent any appropriate transistor configuration, such as a bipolar transistor, a field effect transistor and the like. For example, the first input transistor 211A may represent a bipolar PNP transistor, while, in other cases, a bipolar NPN transistor may be used. In other illustrative embodiments, as will be described later on in more detail, the first input transistor 211A may be provided in the form of a field effect transistor, such as a P-channel transistor or an N-channel transistor. Furthermore, the first input transistor 211A may be connected in series to a first resistive load 212A, which is illustrated as a resistor, wherein, however, any other resistive structures may be used, such as field effect transistors, specifically doped semiconductor areas and the like. In the example shown, the first input transistor 211A may represent an "inverting" input for a first input signal 215A of the comparator circuit 200. It should be appreciated that, depending upon the conductivity type of the input transistor 211A, and the overall configuration of the differential input stage 210, the transistor 211A may represent a "non-inverting" input. Similarly, the input stage 210 may further comprise a second input transistor 211B having substantially the same configuration as the transistor 211A, except for production-induced non-uniformities and/or any intentionally-provided deviations, for instance, with respect to drive-current capability and the like. In some illustrative embodiments, the first and the second input transistors 211A, 221B may be formed on the basis of the same basic design. In the embodiment shown, the transistor 211B may represent the non-inverting input for a signal 215B, wherein, however, the same criteria apply in this case as previously explained with reference to the input transistor 211A.

Furthermore, a second resistive load 212B is connected in series to the second input transistor 211B, wherein, in one illustrative embodiment, the characteristics of the first and the second resistive loads 212A, 212B may differ from each other so as to create a desired offset of predefined polarity. That is, the loads 212A, 212B may be formed with different resistance values, drive current capability and the like, depending on the type of circuit elements used for providing the loads 212A, 212B. In the embodiment shown, an intermediate signal node 214, representing an intermediate signal of the circuit 200, may carry the voltage across the load 212B so that, in combination with an inverting behavior of the output stage 220, a positive digital output signal 221 may be obtained by decreasing the voltage at the node 214, while a negative digital signal level may be obtained by increasing the voltage at the node 214. Hence, the first transistor 211A may act as the inverting input while the second transistor 211B may act as a non-inverting input. It should be appreciated, however, that any other configuration may be used, for instance, by changing the conductivity type of the input transistors 211A, 211B, changing the inverting behavior of the output stage 220 into a non-inverting behavior and the like. Thus, according to the configuration of the input stage 210 and the output stage 220, increasing the value of the resistive load 212B may thus result in a "negative" offset, since, upon supply of a substantially constant current by a constant current source 213, a moderately high increase of voltage may be obtained at the node 214, wherein the mismatch of the loads 212A, 212B may be selected sufficiently large so as to induce a predetermined polarity of the output signal 221 even if respective non-uniformities occur in the other components of the input stage 210. That is, the mismatch between the loads 212A, 212B may, in some illustrative embodiments, be intentionally selected sufficiently large so as to over-compensate for any mismatching of other components within a predetermined range of an allowable degree of mismatch. In this manner, with the offset compensation stage 230 disabled, a predictable polarity of the output signal 221 may be obtained, as long as the device 200 may be within a certain predefined range of tolerable mismatch, which, however, may be selected moderately wide, depending on the desired operational behavior of the circuit 200 and the compensation capability of the stage 230.

In other illustrative embodiments, the loads 212A, 212B may be provided in a substantially similar configuration, wherein the predictable offset polarity may be generated by means of the offset compensation stage 230, as will be described later on.

The stage 230 may comprise a plurality of switchable load elements 231A, 231B, 231C, which may be collectively referred to as switchable load elements 231. For this purpose, respective switches 232A, 232B, 232C may be provided to enable the switching of at least some of the load elements 231 under the control of a control unit 233. Thus, the plurality of switchable load elements 231 may be connected to one or both of the loads 212A, 212B to enable a controllable variation of the total load state of the differential input stage 210. In the embodiment shown, the switchable load elements 231 may be connectable to the second load 212B, thereby enabling a variation of the total effective load for the second input transistor 211B. In the embodiment shown, the basic load 212B may be selected with a moderately high value, which may be selectively reduced by connecting one or more of the load elements 231 in parallel to the load 212B. Furthermore, the control unit 233 may be coupled to the output stage 220 to receive the output signal 221.

During operation of the device 200, an offset calibration mode may be entered at any appropriate time, for instance, after fabricating the device 200 for compensating production-induced mismatches in the input stage 210 and/or during operation of the device 200 at an appropriate period, for instance, during a power-on event and the like. In some illustrative embodiments, during the calibration mode, substantially the same voltage level may be supplied as the first and second input signals 215A, 215B, which may be accomplished by providing these signals by an external source, while, in other cases, an internal reference voltage may be temporarily switched to the first and second input transistors 211A, 211B, as will be described later on. Thus, in this case, a certain degree of mismatch may be present in the input stage 210, which may, in one embodiment, however, be "overridden" by the intentionally provided mismatch between the loads 212A, 212B, resulting in a predictable polarity of the output voltage 221. In other illustrative embodiments, when the loads 212A, 212B are initially provided in a substantially similar configuration, the control unit 233 may activate one of the switchable load elements 231 in order to intentionally obtain a high offset at the node 214, thereby also generating a predictable polarity of the output voltage 221. For example, in the embodiment shown, a total load of the transistor 211B may be reduced by selecting an appropriate value of one of the load elements 231. In this case, the predictable polarity of the output voltage 221 would become negative or be near the lower supply voltage as in the previously discussed case. In other illustrative embodiments, a specific one of the load elements 231 may be connected to the load 212A to reduce the total value thereof, which may also result in a predictable polarity as would be obtained by intentionally increasing the load 212B with respect to the load 212A. Thus, the predictable polarity of the output voltage 221 may also be used as an indicator for the control unit to generate a sequence of different load states, while also monitoring the output signal 221. For instance, an initially high value of the load 212B may be increasingly reduced, until a change of polarity of the output signal 221 may be detected. Consequently, the change of polarity of the output signal 221 may determine an appropriate total load state of the input stage 210, thereby obtaining enhanced matching of the components 211A, 211B, 212A, 212B in combination with the enabled load elements 231 and the component 213. Consequently, during a normal operating mode of the circuit 200, the previously identified configuration of the switched loads 231 may be maintained, thereby providing enhanced uniformity and stability, wherein the "granularity" of the compensation mechanism may be determined by selecting the number of switched load elements, each having a different resistance value. Thus, a specified degree of compensation may be accomplished without requiring additional reference voltages or reference currents while also maintaining overall complexity at a low level, since only a respective number of switches 232 and load elements 231 may be required in combination with the control unit 233, which may also be provided in the form of standard digital circuitry, as will be described with reference to FIG. 2b.

Figure 2B:
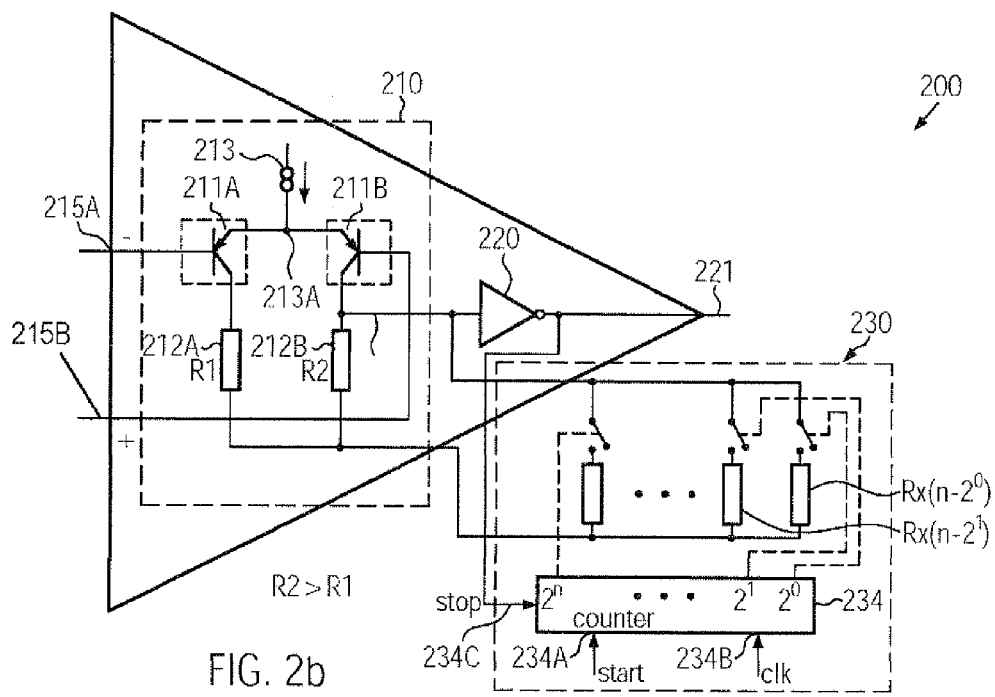
FIG. 2b schematically illustrates a comparator circuit including an offset compensation stage with a plurality of switchable load elements, the switching of which may be controlled on the basis of a counter circuit, according to further illustrative embodiments.

FIG. 2b schematically illustrates the comparator circuit 200 according to a further illustrative embodiment in which the control unit 233 may comprise a counter 234, the outputs of which may be connected to respective ones of the switches 232. Moreover, the counter 234 may comprise an input 234A for starting the counter and a clock 234B. Furthermore, enable/disable input 234C may be connected to the output signal 221. The enable/disable input 234C may be configured such that, when the output signal 221 may have the predictable polarity due to the generation of a predetermined offset, the counter 234 may be enabled. Thus, by ascertaining a signal at the start input 234A, the counter 234 may start counting with a frequency determined by the clock signal at input 234B, thereby activating the switches 232 according to the respective state of the counter outputs. Thus, in one illustrative embodiment, the switched load elements 231 may be configured such that the total resistance of the load elements 231 corresponds to the current counter state, thereby providing an increasing or decreasing sequence of load states, which are thus connected in parallel to the load 212B. For example, the load elements 231B may be selected such that, with an increasing counter value, a total resistance value may decrease. Hence, in total, the effective load of the second transistor 211B may be sequentially reduced, starting from an initially high value, with every increase of the counter value. It should be appreciated, however, that a counter may also be used in which the counter value may be sequentially reduced if deemed appropriate. In this case, the values of the load elements 231 may have to be adapted accordingly. Thus, upon occurrence of a polarity change in the output signal 221, the counter 234 may be disabled by the input 234C, thereby "preserving" the desired total load state for the input stage 210, which may represent a matched configuration with respect to the transistor characteristics of the transistors 211A, 211B and the loads 212A, 212B.

Figure 2C:
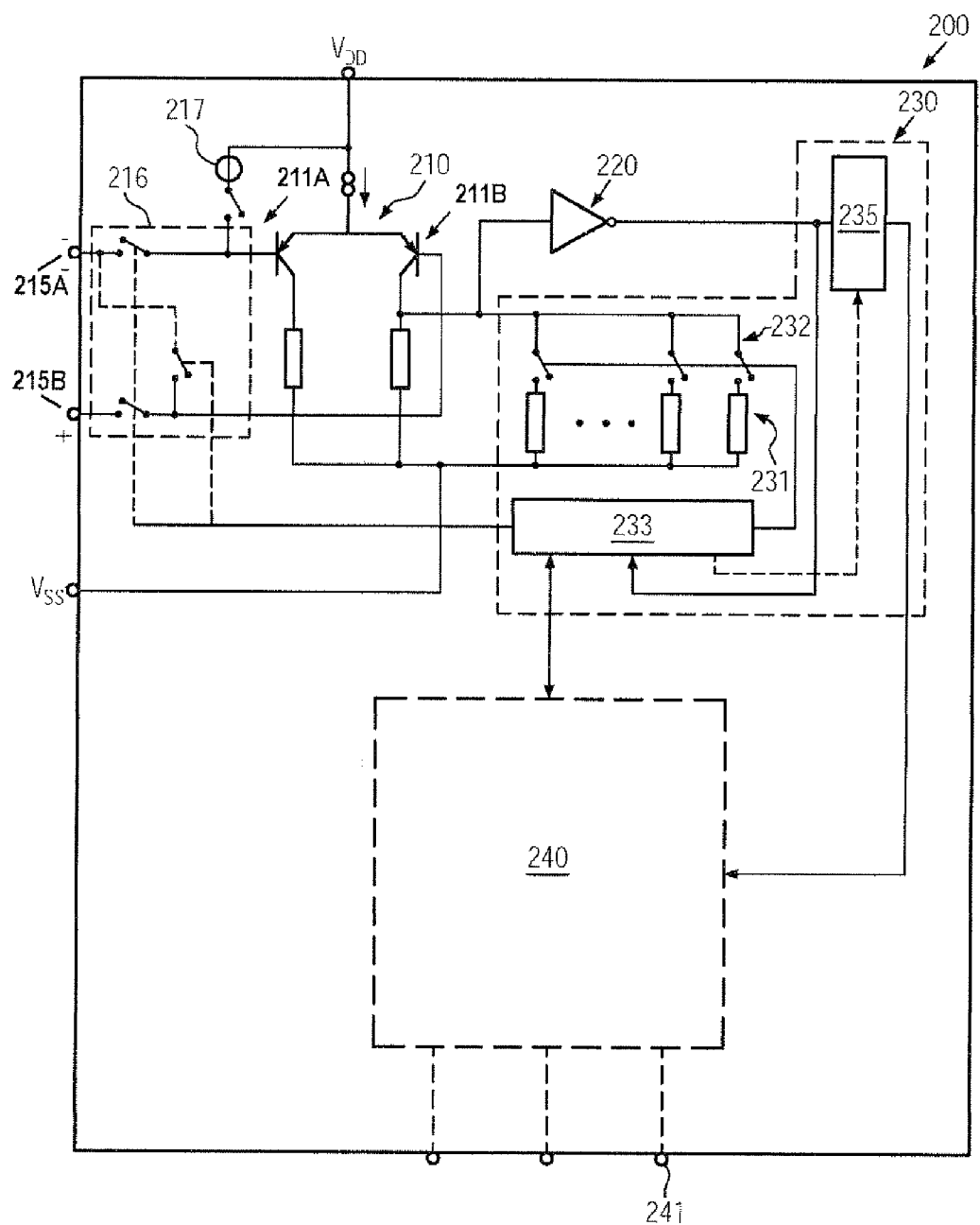
FIG. 2c schematically illustrates a comparator circuit accommodated in a package, possibly in combination with additional functional blocks, according to still further illustrative embodiments.

FIG. 2c schematically illustrates a circuit diagram of the electronic circuit 200 according to further illustrative embodiments. As illustrated, the electronic circuit 200 may comprise the input stage 210, the output stage 220 and the offset compensation stage 230. In one illustrative embodiment, the offset compensation stage 230 may comprise an output buffer 235 that may be controlled by the control unit 233. The output buffer 235 may be connected to the output stage 220 to receive the output signal 221 during a standard operating mode of the circuit 200 and provide the output signal 221 in a substantially "transparent" manner during the standard operating mode of the circuit 200. Upon receiving a signal from the control unit 233, the output buffer 235 may be switched from the "transparent" mode into a buffer mode, thereby maintaining the current output signal irrespective of a later change of the output signal 221. Thus, the circuit 200 may transit into the offset calibration mode, i.e., into a mode for matching the input stage 210 on the basis of the switchable load elements 231, as previously described, while nevertheless, providing a valid output signal via the output buffer 235, even if a change in polarity of the signal 221 may be created during the offset calibration procedure. That is, the circuit 200 may be operated on the basis of a previously determined configuration of the switched load elements 231, as previously explained. If a calibration of the input stage 210 may be desired, for instance, since a calibration mode may be entered on a regular basis, or the control unit 233 may have detected a significant change of environmental conditions, or a respective calibration mode may be instructed by an external source, and the like, the control unit 233 may instruct the output buffer 235 to hold the output level constant, irrespective of any polarity changes of the signal 221 obtained from the output stage 220. Thereafter, the control unit 233 may provide a predictable offset to induce a predictable polarity of the output signal 221, a change of which may be caused by applying different load values via the switchable load elements 231, as previously explained.

Thus, after detecting the polarity change, a respective configuration of the load elements 231 may be used for the further operation of the circuit 200 and the output buffer 235 may be set into its transparent mode. In some illustrative embodiments, the calibration mode may be performed on the basis of an appropriately set input signal, for instance, by providing an input switch array 216 configured to enable the supply of substantially the same input signal to both input transistors 211A and 211B. This may be accomplished, for instance, by interrupting one of the two external input signals 215A, 215B, and applying the other one of these input signals to the other one of the respective inputs. In other cases, both input signals 215A, 215B may be interrupted and the transistors 211A, 211B may be connected with a reference voltage source 217, the characteristics of which may, however, not be critical, as long as a substantially similar input voltage is provided to both transistors 211A, 211B. For instance, the reference voltage 217 may be obtained from the supply voltage $V_{DD}$ on the basis of a voltage divider and the like. Thus, upon entering the offset calibration mode, the control unit 233 may also appropriately configure the switch array 216 in order to provide a common input voltage for both differential inputs 211A, 211B, while also the output buffer 235 may be operated, as previously described. Consequently, the circuit 200 may remain connected to an external circuitry when performing the offset calibration procedure without significantly interfering with the overall circuit function, except for a short time period corresponding to the offset calibration in which the output voltage provided by the output buffer 235 may not respond to the external input voltages 215A, 215B. However, a respective calibration phase may be selected moderately short so that, for a plurality of applications, a respective "delay" for responding to a variation of the input signal 215A, 215B on the order of the duration of the calibration phase may be acceptable. Furthermore, the calibration phase may be performed with an appropriate frequency so as to not unduly disturb the functionality of an overall circuit.

According to further illustrative embodiments, the electronic circuit 200 may further comprise a functional circuit block 240, which may comprise analog circuitry, digital circuitry and the like in accordance with device requirements. For example, the functional block 240 may be connected to the output stage 220 to receive the signal 221 therefrom, while additional I/O functionality, by means of terminals 241, may also be provided as required for the operation of the functional block 240. Moreover, respective terminals 241 may also be provided for the supply voltage of the circuit 200 and for receiving the external input signals 215A, 215B. In one illustrative embodiment, the offset compensation stage 230 may be provided without a direct connection to one of the terminals 241, thereby providing the possibility of designing enhanced circuitry without requiring additional I/O resources. Thus, circuit designs corresponding to a specified package type and thus a specified number of I/Os may be used, while additionally enabling enhancement of the operational behavior of the respective comparator circuit block on the basis of the techniques described herein. Moreover, in some illustrative embodiments, the functional block 240 may be connected to the output stage 220 via the output buffer 235, as previously described, thereby also enabling the operation of the functional block 240 even during an offset compensation phase, as previously described. In some illustrative embodiments, the functional block 240 may communicate with the control unit 233 to "coordinate" the operation of the functional block 240 in view of the performance of calibration phases for the input stage 210, as previously described. That is, the functional block 240 may communicate to the control unit 233 an appropriate point in time for performing a calibration phase or may instruct a calibration phase, without interfering with the overall functioning of the circuit 200.

Figure 2D:
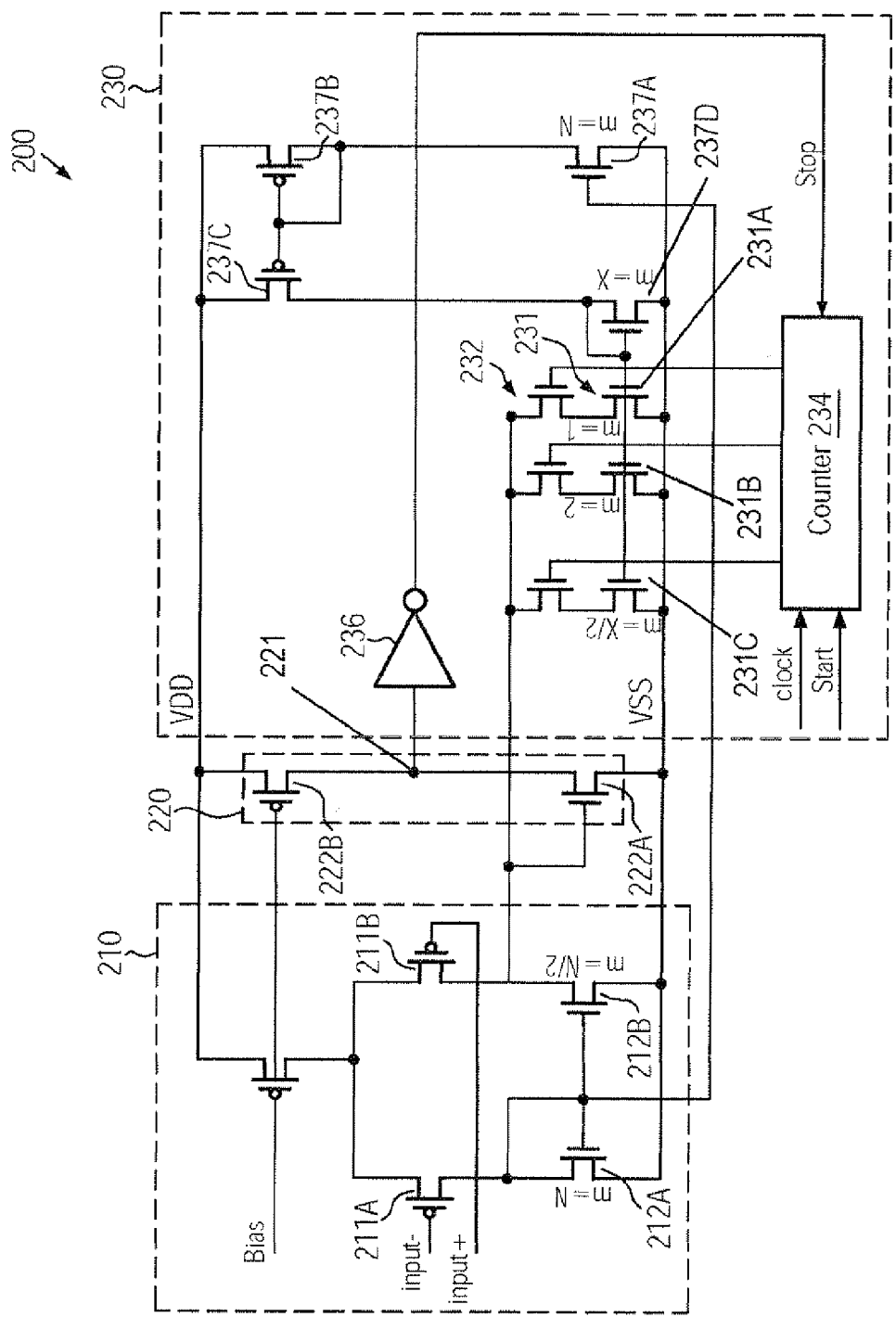
FIG. 2d schematically illustrates a cross-sectional view of an integrated circuit comprising a comparator circuit including an offset compensation stage according to further illustrative embodiments.

FIG. 2d schematically illustrates the circuit 200 according to a further illustrative embodiment in which field effect transistors, such as MOS transistors, may be used in the input stage 210, the output stage 220 and the compensation stage 230. In one illustrative embodiment, the input transistors 211A, 211B may be provided in the form of P-channel transistors, while the loads 212A, 212B may be provided as N-channel transistors, wherein, in the embodiment shown, the drive current capability of the load or transistor 212B may be less, for instance, one half of the transistor 212A. It should be appreciated that, as previously explained, N-channel transistors may be used for input transistors 211A, 211B and, for instance, P-channel transistors may be used for the loads 212A, 212B, depending on the overall device configuration. Furthermore, the current source 213 may be provided in the form of a P-channel transistor, wherein, also in this case, an N-channel transistor may be used, by appropriately adapting the overall configuration of the input stage 210. Furthermore, the output stage 220 may comprise an N-channel transistor 222A and a P-channel transistor 222B, wherein the gate of the N-channel transistor 222A may be connected to the node 214. Thus, by appropriately selecting the overall characteristics of the transistor 222A, for instance by appropriately selecting a threshold voltage thereof, i.e., a voltage upon a conductive channel is formed in the transistor 222A, a substantially digital behavior of the transistor 222A may be obtained for a voltage at the node 214 that is below and above the respective threshold voltage. It should be appreciated, however, that the output stage 220 may have any other appropriate configuration to provide the desired digital response with respect to a "pre-amplified" voltage variation at the node 214.

Furthermore, the compensation stage 230 may comprise a control unit, for instance in the form of a counter 234, as previously explained, which may be enabled/disabled by means of an inverter 236. Additionally, in the embodiment shown, the switched load elements 231 may be provided in the form of N-channel transistors having appropriately selected drive current capabilities, for instance, by adapting the width to length ratio of these transistors. Furthermore, the switches 232 may be provided in the form of N-channel transistors connected in series to a respective one of the node elements 231, wherein the gates of the switches 232 may be connected to respective counter outputs, as previously explained. Thus, each counter value may be associated with a discrete value of the load element 231, as previously described. In the embodiment shown, the first load element 231A may have a drive current capability determined by one "unit," the second load element 231B may have a drive current capability defined by two units, the next one may have a drive current capability defined by four units, and so on, until the last load element 231C may have a drive current capability determined by x/2, thereby obtaining a total drive current capability x units for the entire array 231.

In addition, the compensation stage 230 may comprise a current mirror including a transistor having the same drive current capability as the load 212, thereby inducing a corresponding current through a P-channel transistor 237B, the current of which may be mirrored into a further P-channel transistor 237C, which finally induces a respective current in a further N-channel transistor 237D with a drive current capability corresponding to the entirety of the elements 231. Since the gate electrodes of the load elements 231 are connected to the gate and drain of the transistor 237D, the same load conditions may be created in the elements 231, however, scaled by the respective drive current capabilities. Hence, an influence of the switching elements 232 on the drive current capabilities of the individual loads 231 may be substantially reduced by the sequence of current mirrors 237A, 237B, 237C, 237D.

During operation of the circuit 200, the loads 212A, 212B, having a highly asymmetric configuration, may result in a corresponding predictable output voltage 221, as previously explained. It should be appreciated that, in the present disclosure, "resistive load" may also include "diode structure," as is, for instance, realized in the load 212A, which may act as a current mirror for the load 212B. Similarly, the transistors 231 may also be understood as resistive load elements in the context of the present disclosure. Thus, without adding any of the load elements 231, a negative or a low logic state may be obtained for the output signal 221 due to the offset generated by the load 212B having a higher resistance compared to the load 212A. Consequently, the inverter 236 may enable the counter 234, which begins to count upon application of a start signal. Thus, upon increasing the counter value, the drive current capability of the load 212B may also be increased, due to the parallel connection of respective load elements 231, which may finally result in a change of polarity of the output signal 221, when the transconductance of the input transistors 211A, 211B and the load value in the input stage 210 may substantially match in the branches 211A, 212A, and 211B, 212B. Upon the occurrence of a respective polarity change, the inverter 236 may disable the counter 234, and the appropriate load state may be preserved in the array 231, as previously explained.

Figure 2E:
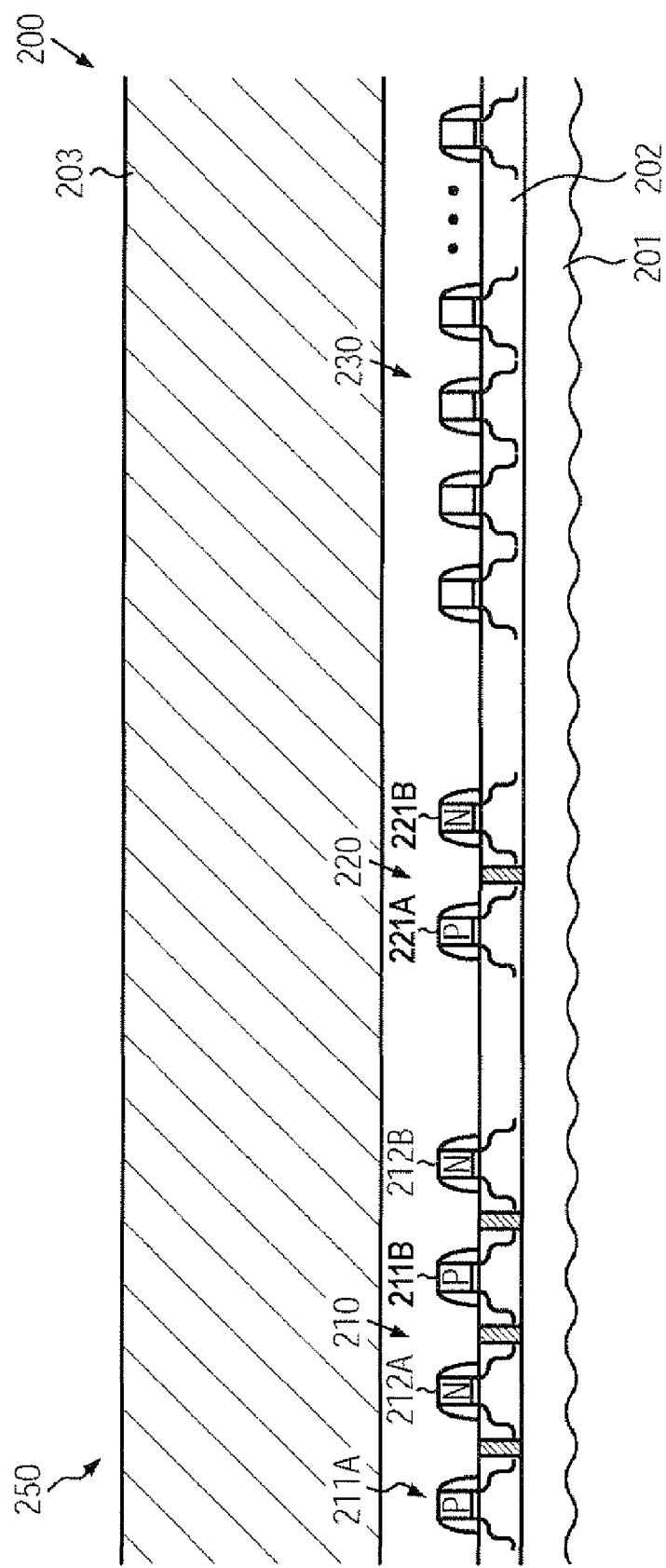
FIG. 2e schematically illustrates a circuit diagram of a comparator circuit including an offset compensation stage, in which the control of switchable resistive loads may be accomplished on the basis of a counter circuit, according to still further illustrative embodiments.

FIG. 2e schematically illustrates a cross-sectional view of an integrated circuit 250 including the electronic circuit 200. The integrated circuit 250 may comprise a substrate 201, which may represent any appropriate carrier material for forming thereon a semiconductor layer 202, in and above which respective circuit elements, such as transistors, capacitors, resistors and the like, may be formed on the basis of well-established manufacturing techniques. For instance, the semiconductor layer 202 may represent a silicon-based layer, or any other appropriate semiconductor material, depending on the overall device requirements. In the embodiment shown, the electronic circuit 200 may comprise the input section 210, which may include a plurality of transistors, such as the input transistors 211A, 211B and the loads 212A, 212B. Similarly, the output stage 220 may comprise a plurality of transistor elements, such as the transistors 221A, 221B. Moreover, the offset compensation stage 230 may also comprise a plurality of transistor elements, such as the transistors 232 and the load elements 231 as shown in FIG. 2d. Furthermore, the integrated circuit 250 may comprise a metallization layer 203 comprising dielectric materials and metal lines and vias as required for operatively connecting the various circuit elements formed in and above the semiconductor layer 202. It should be appreciated that further circuit elements may be provided in the integrated circuit 250, for instance, for the functional block 240 (see FIG. 2c) and the like.

The integrated circuit 250 may be formed on the basis of well-established manufacturing techniques, for instance using CMOS technology for forming respective P-channel transistors and N-channel transistors, as, for instance, illustrated in FIG. 2d. Furthermore, during the respective manufacturing techniques, the load elements 231 and the loads 212A, 212B may be provided with any appropriate width to length ratio so as to appropriately adjust the drive current capability, as previously explained. Consequently, after the fabrication of the integrated circuit 250, a calibration mode may be entered, at least once, and the input stage 210 may be adjusted on the basis of the load elements in the compensation stage 230 to reduce production-induced non-uniformities. Hence, the integrated circuits 250 may be provided with a high degree of uniformity with respect to offset characteristics of the input stage 210. In other cases, respective calibration phases may be performed at any appropriate stage, as previously explained.

As a result, the present disclosure provides electronic circuits, integrated circuits and methods for operating the same in which an offset calibration of a comparator may be accomplished on the basis of switched load elements to provide discrete load states in the input stage of the comparator. Consequently, an appropriate configuration of the load state of the input stage may be selected and may be used for the further operation of the device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An electronic circuit, comprising:
a differential input stage having a first input transistor and a second input transistor for receiving a first analog input signal and a second analog input signal, respectively, said differential input stage being configured to provide an intermediate signal representing a difference between said first and second input signals;
an output stage coupled to said differential input stage to receive said intermediate signal and configured to provide a digital output signal on the basis of said intermediate signal; and
an offset compensation stage coupled to said differential input stage and said output stage, said offset compensation stage being configured to receive said digital output signal and to change a resistive load of one of the first and second input transistors in one or more discrete steps on the basis of said digital output signal.

2. The electronic circuit of claim 1, wherein said offset compensation stage comprises a plurality of switchable resistive load units and a control unit configured to receive said digital output signal and control switching of said switchable load units on the basis of said digital output signal.

3. The electronic circuit of claim 2, wherein said control unit comprises a counter having a plurality of counter outputs, wherein each of said plurality of counter outputs is connected to switch a respective one of said plurality of switchable loads.

4. The electronic circuit of claim 3, wherein said control unit is further configured to stop said counter when said digital output signal changes.

5. The electronic circuit of claim 1, wherein said offset compensation stage further comprises an input selection stage configured to temporarily supply the same voltage signal to said first and second input transistors.

6. The electronic circuit of claim 1, wherein a load mismatch between said first and second input transistors is maximal with said offset compensation stage being disabled.

7. The electronic circuit of claim 1, wherein said first and second input transistors are field effect transistors.

8. The electronic circuit of claim 7, wherein a first load of said first input transistor and a second load of said second input transistor are provided as field effect transistors.

9. The electronic circuit of claim 8, wherein said offset compensation stage comprises a plurality of field effect transistors that are individually connectable to at least one of said first and second loads.

10. The electronic circuit of claim 1, further comprising a package and input/output terminals for communication with peripheral devices, wherein said offset compensation stage is provided without a direct connection to said input/output terminals.

11. The electronic circuit of claim 1, further comprising a functional circuit block connected to receive said digital output signal, wherein said functional circuit block is configured to provide at least one output signal on the basis of said digital output signal.

12. The electronic circuit of claim 11, further comprising a common package accommodating said differential input stage, said output stage, said offset compensation stage and said functional circuit block.

13. The electronic circuit of claim 1, wherein said offset compensation stage is further configured to temporarily hold said digital output signal while changing the load of one of the first and second input transistors.

14. An integrated circuit, comprising:
a substrate;
a first input transistor and a second input transistor formed above said substrate, said first and second input transistors forming a differential input stage for receiving a first analog input signal and a second analog input signal, respectively, said differential input stage being configured to provide an intermediate signal representing a difference between said first and second input signals;
a plurality of output transistors formed above said substrate so as to form an output stage coupled to said differential input stage to receive said intermediate signal and configured to provide a digital output signal on the basis of said intermediate signal; and
a plurality of control transistors formed above said substrate so as to form an offset compensation stage coupled to said differential input stage and said output stage, said offset compensation stage being configured to receive said digital output signal and to change a load of one of the first and second input transistors in discrete steps on the basis of said digital output signal.

15. The integrated circuit of claim 14, wherein said first and second input transistors are provided as field effect transistors.

16. The integrated circuit of claim 15, wherein a first load connected to said first input transistor and a second load connected to said second input transistor are provided as field effect transistors.

17. The integrated circuit of claim 16, wherein said plurality of control transistors comprises two or more load field effect transistors connectable to at least one of said first and second loads.

18. The integrated circuit of claim 17, wherein said plurality of control transistors comprises transistors forming a counter circuit controlling said two or more load field effect transistors so as to connect said two or more load field effect transistors to at least one of said first and second loads according to a counter state of said counter.

19. A method for compensating an offset of a comparator comprising an output stage, the method comprising:
creating a plurality of different load states of a load of one of a first input transistor and a second input transistor of said comparator during an offset calibration mode;
monitoring an output voltage of said output stage of said comparator for said plurality of different load states; and
selecting one of said plurality of different load states for operating said comparator in a normal operating mode.

20. The method of claim 19, wherein selecting one of said plurality of different load states comprises creating said plurality of different load states as one of an increasing sequence and a decreasing sequence of load states and determining a first load state of the one of an increasing and decreasing sequence for which said output signal changes.

21. The method of claim 19, further comprising supplying substantially the same signal to said first and second input transistors during said offset calibration mode.

22. The method of claim 19, wherein said calibration mode is enabled upon a power-on event of said comparator.

23. The method of claim 19, further comprising buffering said output signal to provide a buffered output signal during said normal operating mode and using a non-buffered version of said output signal for selecting said load state during said offset calibration mode.

* * * * *